(12) United States Patent
Petroianu et al.

(10) Patent No.: US 10,761,119 B2
(45) Date of Patent: Sep. 1, 2020

(54) VOLTAGE THRESHOLD SENSING SYSTEMS AND RELATED METHODS

(71) Applicant: SEMICONDUCTOR COMPONENTS INDUSTRIES, LLC, Phoenix, AZ (US)

(72) Inventors: Catalin Ionut Petroianu, Bucharest (RO); Alexandra-Oana Petroianu, Bucharest (RO); Pavel Londak, Hutisko Solanec (CZ)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 59 days.

(21) Appl. No.: 15/961,698

(22) Filed: Apr. 24, 2018

(65) Prior Publication Data

US 2019/0056435 A1    Feb. 21, 2019

Related U.S. Application Data

(60) Provisional application No. 62/546,701, filed on Aug. 17, 2017.

(51) Int. Cl.
*G01R 19/165* (2006.01)

(52) U.S. Cl.
CPC . *G01R 19/16576* (2013.01); *G01R 19/16519* (2013.01); *G01R 19/16523* (2013.01)

(58) Field of Classification Search
CPC ........ G01R 19/16576; G01R 19/16519; G01R 19/16523; H02M 2001/0009; H03L 7/148
USPC ....... 324/140 R, 200, 207.13, 239, 500, 515, 324/520–530, 750.06, 600, 609, 686, 324/76.11, 76.75
See application file for complete search history.

(56) References Cited

U.S. PATENT DOCUMENTS

| 7,141,955 B1 * | 11/2006 | Martinez | H03K 17/0822 323/272 |
| 2007/0108941 A1 | 5/2007 | Sainomoto et al. | |
| 2018/0150093 A1 * | 5/2018 | Poletto | G05F 1/575 |
| 2019/0141265 A1 * | 5/2019 | Finateu | H04N 5/3559 |

* cited by examiner

*Primary Examiner* — Melissa J Koval
*Assistant Examiner* — Trung Nguyen
(74) *Attorney, Agent, or Firm* — Adam R. Stephenson, Ltd.

(57) ABSTRACT

Implementations of voltage sensing systems may include: a high side current mirror coupled to a reference current source coupled to at least one diode. The at least one diode may be coupled to a resistor and to a comparator. The resistor may be coupled to the ground. The comparator may be coupled with a reference voltage. The comparator may be configured to receive a comparison voltage from the diode and output whether the comparison voltage is higher or lower than the reference voltage.

10 Claims, 10 Drawing Sheets

VOLTAGE THRESHOLD SENSING SYSTEMS AND RELATED METHODS

CROSS REFERENCE TO RELATED APPLICATIONS

This document claims the benefit of the filing date of U.S. Provisional Patent Application 62/546,701, entitled "Voltage Threshold Sensing System and Related Methods" to Catalin-Ionut Petroianu et al. which was filed on Aug. 17, 2017, the disclosure of which is hereby incorporated entirely herein by reference.

BACKGROUND

1. Technical Field

Aspects of this document relate generally to systems and methods for determining whether an input voltage is above, below, or equal to a reference voltage value.

2. Background

Generally, to compare a higher valued voltage with a lower reference voltage used as a voltage threshold, the higher voltage is divided with a resistive divider and uses a comparator that compares the now divided voltage with a lower reference voltage.

SUMMARY

Implementations of voltage sensing systems may include: a high side current mirror coupled to a reference current source coupled to at least one diode. The at least one diode may be coupled to a resistor and to a comparator. The resistor may be coupled to the ground. The comparator may be coupled with a reference voltage. The comparator may be configured to receive a comparison voltage from the diode and output whether the comparison voltage is higher or lower than the reference voltage.

Implementations of voltage sensing systems may include one, all, or any of the following:

The at least one diode may be a Zener diode.

The current mirror may further include two p-channel metal oxide semiconductor field effect (PMOS) transistors coupled together.

A gate of each of the two PMOS transistors may be coupled to a drain of one of the two PMOS transistors.

The system may further include a second comparator coupled with a second reference voltage and configured to receive a second comparison voltage from the diode and output whether the comparison voltage is one of higher and lower than the reference voltage.

The system may further include a second resistor coupled between the current mirror and the comparator.

Implementations of voltage sensing systems may include: a first high side current mirror including a first transistor and a second transistor. The first high side current mirror may be coupled to a first reference current. The system may include a second high side current mirror comprising a third transistor and a fourth transistor. The second high side current mirror may be coupled to a second reference current. The system may include at least one diode coupled between the first high side current mirror and the second high side current mirror. The at least one diode may be coupled to a comparator. The first high side current, the second high side current, and the at least one diode may be coupled to ground.

A current passed by the second transistor may be greater than a current passed by the fourth transistor. The comparator may be coupled with a reference voltage and configured to receive a comparison voltage from the diode and output where the comparison voltage is higher or lower than the reference voltage.

Implementations of voltage sensing systems may include one, all, or any of the following:

The system may further include a fifth transistor coupled between the second high side current mirror and the comparator.

The fifth transistor may be a n-channel metal-oxide-semiconductor field-effect (NMOS) transistor.

The at least one diode may be a Zener diode.

A gate of the first transistor and a gate of the second transistor may be coupled to a drain of the first transistor or the second transistor.

A gate of the third transistor and a gate of the fourth transistor may be coupled to a drain of the third transistor or the fourth transistor.

The first current mirror and the second current mirror may further include two PMOS transistors coupled together.

The gate of the fifth transistor may be coupled to the output of the fifth transistor.

Implementations of voltage sensing systems may include: two p-channel metal-oxide-semiconductor field-effect (PMOS) transistors coupled together. The gates of the two PMOS transistors may be coupled to the drain of a first one of the two PMOS transistors. The drain of the first one of the two PMOS transistors may be coupled with a constant current source. A drain of a second one of the two PMOS transistors may be coupled to a diode. The diode may be coupled with a high impedance input of a comparator and to a resistor coupled to ground. The comparator may configured to determine whether a supply voltage coupled to the second one of the two PMOS transistors is above or below a reference voltage coupled to another high impedance input of the comparator.

Implementations of voltage sensing systems may include one, all, or any of the following:

The diode may be a Zener diode.

The system may further include a second comparator coupled with a second reference voltage and configured to receive a second comparison voltage from the diode and output whether the comparison voltage is higher or lower than the reference voltage.

The foregoing and other aspects, features, and advantages will be apparent to those artisans of ordinary skill in the art from the DESCRIPTION and DRAWINGS, and from the CLAIMS.

BRIEF DESCRIPTION OF THE DRAWINGS

Implementations will hereinafter be described in conjunction with the appended drawings, where like designations denote like elements, and.

DESCRIPTION

This disclosure, its aspects and implementations, are not limited to the specific components, assembly procedures or method elements disclosed herein. Many additional components, assembly procedures and/or method elements known in the art consistent with the intended voltage sensing systems will become apparent for use with particular implementations from this disclosure. Accordingly, for example, although particular implementations are disclosed, such implementations and implementing components may comprise any shape, size, style, type, model, version, measurement, concentration, material, quantity, method element, step, and/or the like as is known in the art for such voltage sensing systems, and implementing components and methods, consistent with the intended operation and methods.

Figure 1:
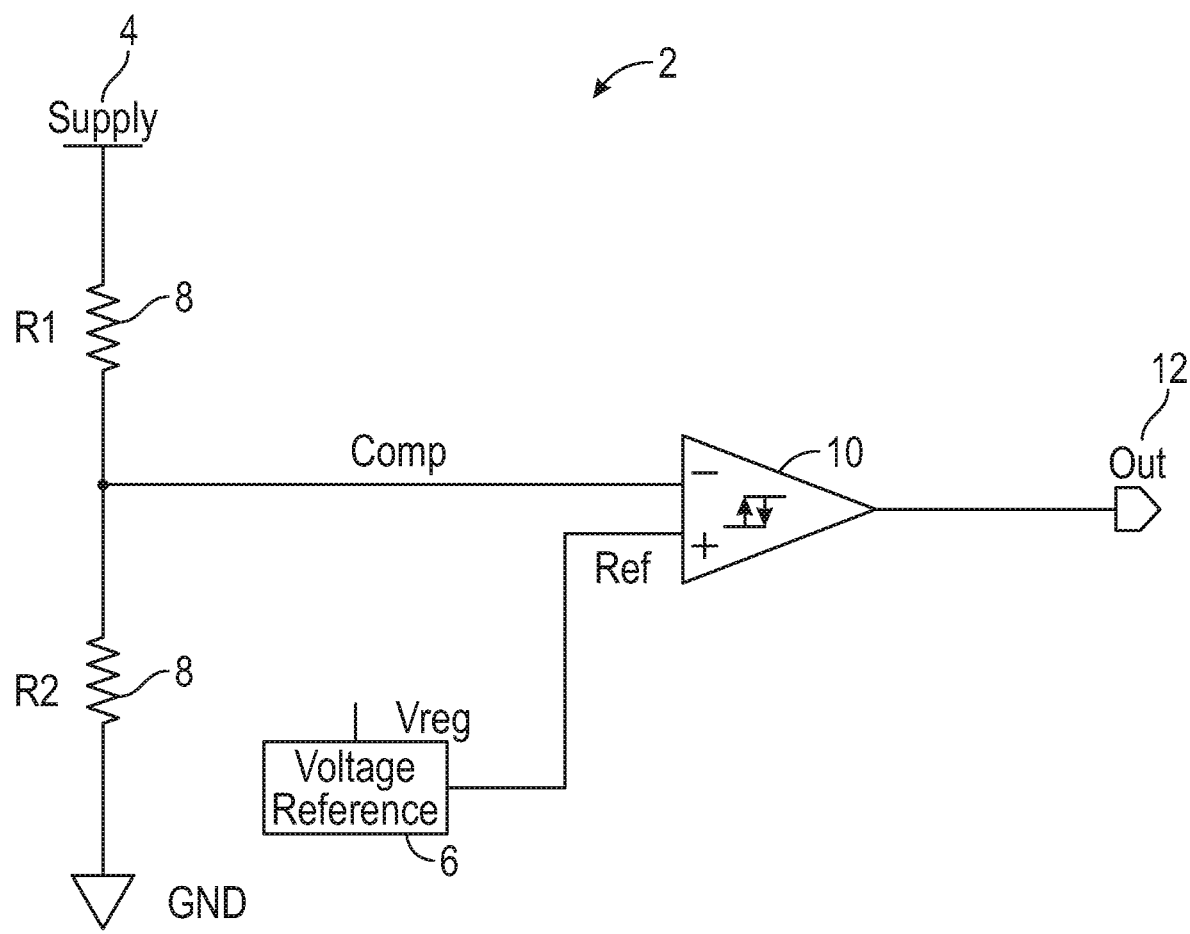
FIG. 1 is a schematic of a voltage sensing circuit.

Referring to FIG. 1, a system 2 for comparing (sensing) a higher valued voltage with a lower valued reference voltage used as a voltage threshold is illustrated. As illustrated, the circuit of system 2 divides the higher voltage with a resistive divider and uses a comparator that compares the now divided voltage with a lower reference voltage. As illustrated in FIG. 1, where the supply voltage 4 has a higher potential (value) than the reference voltage $V_{reg}$ 6, in order to permit accurate comparison, the voltage is divided between two resistors 8 and fed into a comparator 10. The comparator circuit 10 then outputs 12 the appropriate signal (or no signal) depending upon how the comparator circuit 10 is designed if the input voltage 4 is higher or lower than the reference voltage $V_{reg}$ 6.

This resistive divider system 2, implemented using those standard resistor designs and types in a complementary metal oxide semiconductor (CMOS) process technology, may exhibit any of the following: large area size for the system when current consumption by the system needs to be low; high current consumption when the system area size needs to be low; internal variations of the reference voltage and/or offset of the comparator (due to process corners and/or device mismatch) may be multiplied by the gain of the resistive divider resulting in a higher variability in the voltage threshold detection of the system. Compensating for these issues may translate into requiring use of complex internal circuit blocks which can increase the current consumption of the conventional system and/or increase the die size. Furthermore, to be able to sense whether the voltage is over or under the threshold voltage to a defined level of accuracy, some form of trimming via fuses, etc. is necessary with systems such as these to compensate for process and component variations in the system. Finally, the resistive voltage divider will consume at least some current; the current consumption of the system will increase as the sensed input voltage increases.

Figure 2:
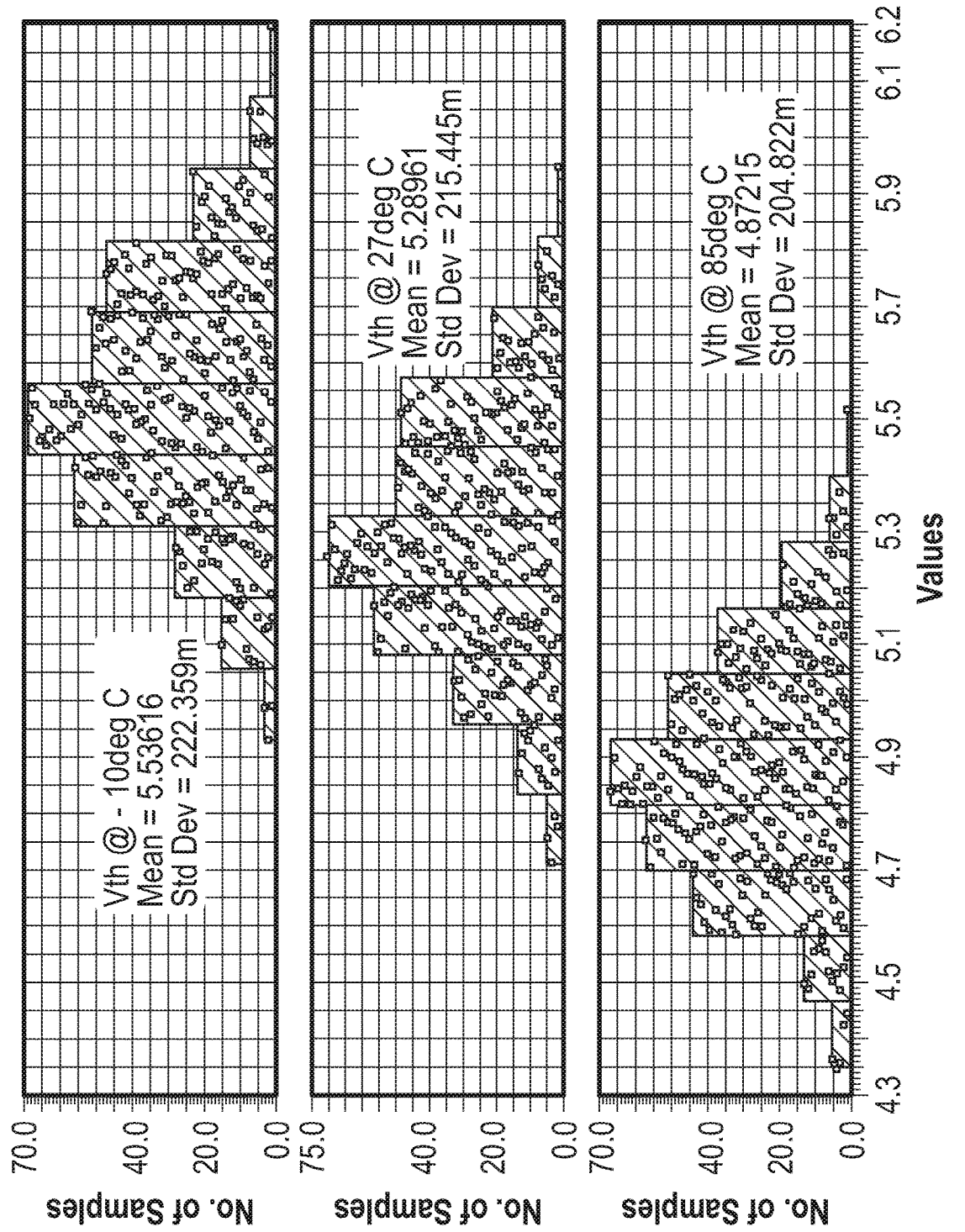
FIG. 2 shows graphs of the rising threshold voltage for a resistive divider circuit in FIG. 1.

For systems like those in system 2, the effect of temperature on system operation may further act to impede the accuracy of the system. For the system 2 illustrated in FIG. 1, all variations from the internal circuit component blocks (variations in the voltage reference, the offset of the comparator, etc.) are multiplied by the gain of the resistive divider, where the gain is defined as gain=(R2+R1)/R2, at each temperature. Referring to FIG. 2, graphs of the rising threshold voltage for a resistive divider circuit 2 placed in the system model illustrated in FIG. 4 and the performance tested using a Monte Carlo simulation using 300 runs at each temperature are illustrated. The use of the Monte Carlo simulation was done to simulate the effects of process technology variations in the components of the system and temperature variations of the system itself. The resistor sizing was adjusted so that the results of the experiment would produce rising voltage threshold values similar to those disclosed by the system illustrated in FIG. 4, which will be discussed later in this document while keeping all the internal components of the system the same (voltage reference value, comparator, etc.).

By inspection of the graphs, the resistive divider results in high voltage variation across temperatures (comparing the mean values across temperature) and across processes (comparing the standard deviations of each histogram at each temperature).

TABLE 1

| Temp [° C.] | Mean [V] | Std. Dev. [V] | UL = Mean + 6 * (Std. Dev.) [V] | LL = Mean − 6 * (Std. Dev.) [V] | (UL − Mean)/Mean [%] | (LL − Mean)/Mean [%] |
| --- | --- | --- | --- | --- | --- | --- |
| −10 | 5.536 | 2.22E−01 | 6.870 | 4.202 | 24.1% | −24.1% |
| 27 | 5.290 | 2.15E−01 | 6.582 | 3.997 | 24.4% | −24.4% |
| 85 | 4.872 | 2.05E−01 | 6.101 | 3.643 | 25.2% | −25.2% |

Table 1 shows the summary data output values from the Monte Carlo simulation for the resistive divider system 2 shown in FIG. 1. The simulation was carried out at −10° C., 27° C., and 85° C. with a desired threshold voltage set at 5.3 V. The temperature range was designed to include the operating temperature range for consumer electronics of between 0° C. to 70° C. However, were the temperature range of the simulations done to include the automotive standard (extended range) of −40° C. to 125° C., the observed variation in outputs from the system would be higher than those disclosed in these experiments. The supply voltage for the experiment varied from 0 V to about 40 V and was ramped during each subsequent Monte Carlo run by 30 mV per microsecond from 0 V to about 40 V to create rising threshold value observations (observations taken as the supply voltage is rising rather than falling). While these values were selected for the purposes of conducting the simulation, the performance of actual threshold voltage sensing systems is not a function of the particular threshold voltage or voltage ramping rates/slopes. The implementations are designed to sense movement in the supply voltage using any voltage ramping rate/slope and supply voltage according to the design of the circuit for specific applications. As can be observed by inspecting the values in Table 1, the average threshold voltage detectable by the system varied significantly across temperature and also across the process window itself [see the 24+% upper limit (UL) and lower limit (LL) values in Table 1]. If the specification for threshold voltage variation is 2% at 27° C. temperature and 5% across all temperatures from −10° C. to 85° C., the resistive divider does not produce results meeting that standard based on the Monte Carlo simulation results.

Figure 3:
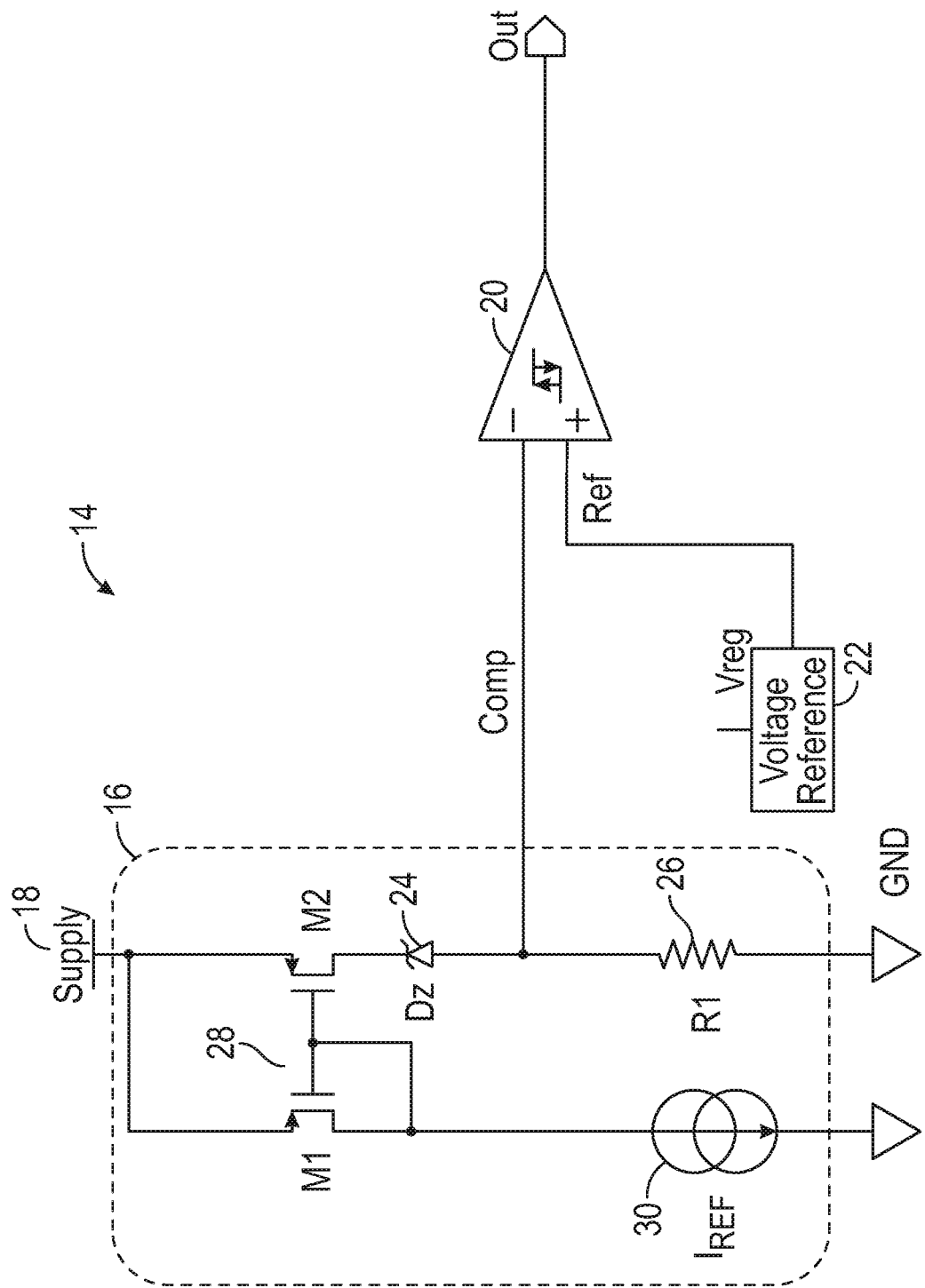
FIG. 3 is a schematic of an implementation of a voltage sensing circuit.

Referring to FIG. 3, a circuit diagram of an implementation of a threshold voltage sensing circuit 14 is illustrated. As illustrated, the section 16 of the circuit in dotted lines is the portion that differs in structure from the resistive divider circuit system 2 illustrated in FIG. 1, and this portion of the circuit processes the supply voltage 18 to generate the comparison voltage fed into the comparator 20 for use in comparing with the reference voltage $V_{reg}$ 22. The circuit 14 of FIG. 3 uses a high side current source in series with a Zener diode 24 and a resistor 26 to create a comparison voltage from the supply voltage 18.

Described another way, FIG. 3 illustrates a high side current mirror 28 coupled to a reference current source 30. The high side current mirror 28 and reference current source 30 are coupled to at least one diode 24. In other implementations, more diodes may be used. The diode may be a Zener diode in various implementations. As illustrated, the at least one diode 24 is coupled to a resistor 26 and to a comparator 20. The comparator 20 is coupled with a reference voltage 22 and the comparator 20 is configured to receive a comparison voltage from the diode 24 and output whether the comparison voltage is higher or lower than the reference voltage.

In specific implementations, to detect a desired threshold of an increasing/decreasing input supply voltage, the circuit includes the following: a PMOS current mirror 28 (M1 and M2) which act to copy a reference current from a reference current source 30 ($I_{ref}$) to output to a Zener diode ($D_z$) 24, a resistor (R1) 26 to produce a comparison voltage (comp). The comparison voltage is then input to the comparator 20 along with the voltage reference 22 to produce the comparator output. The PMOS transistors M1, M2 that form the current mirror have their sources connected together to the sensed input voltage. The gates of the PMOS transistors M1, M2 are also connected together to the drain of the first PMOS transistor M1, and the second PMOS transistor M2's drain forms the current mirror output. The Zener diode $D_z$ has its cathode connected to the output of the current mirror (from transistor M2) and its anode connected to the first terminal of the resistor R2 and also to one of the inputs of the comparator (which may be a high impedance input in various implementations). Which high impedance input of the comparator the anode is coupled with depends on the output polarity desired [whether logic/output signal high (1) or logic low (0) is desired when the comparison voltage exceeds a certain level]. As illustrated, the other high impedance input of the comparator is connected to a voltage reference $V_{ref}$. The other terminal of the resistor R1 is connected to ground.

Because of the structure of this circuit, implementations of the system are able to more accurately detect input voltage thresholds higher than the Zener diode's breakdown voltage plus the reference voltage. The circuit design has the property that, when the input supply voltage is lower than the Zener breakdown voltage, the output current from the PMOS current mirror is null (substantially zero). This function of the circuit works to ensure that the circuit has a low quiescent current when the input supply voltage is below the Zener diode breakdown voltage. Because of this ability of the circuit to ensure low quiescent current, in various implementations there may be no need for including an induced sleep mode function for the overall system/device to prevent current draw. Furthermore, when the input supply voltage is higher than the Zener diode breakdown voltage but lower than the desired threshold voltage, the output current of the current mirror begins increasing. Because the output of the current mirror, the Zener diode, and the resistor R1 are in series and since the inputs of the comparator in various implementations may be high impedance in particular implementations, the currents through each portion of the circuit may remain substantially the same, permitting the voltage over the resistor to mimic any rising/falling slope of the input supply voltage shifted by the Zener diode breakdown voltage. When the input supply voltage is higher than the sum of the Zener diode breakdown voltage and the reference voltage, the voltage on the resistor may mimic any rising/falling of the input supply voltage (shifted by the Zener breakdown voltage) until the output current of the current mirror reaches a maximum value determined by the ratio of the reference current and the current mirror. This behavior limits the total current consumption of the circuit in spite of continuing increases in the input supply voltage.

When the input supply voltage is equal to the sum of the Zener breakdown voltage and the reference voltage, the comparator outputs its output signal (a 0 or a 1, or other signal depending on the structure of the particular comparator being used and whether an inverter is also present). This output signal may be any output from any of a wide variety of comparators. The output signal may be used in a wide variety of applications where detection of a voltage level relative to a threshold voltage is needed, including, by non-limiting example, battery charging, sensor signaling, electrical switching applications, fault detection, and many others.

Although the above implementation utilizes Zener diodes in breakdown mode to shift the input voltage to a lower voltage level closer to the voltage reference level while maintaining the same voltage behavior in time, other types of diodes may be used to create similar effects. By non-limiting example, in various implementations, two or more forward biased diodes in series may be employed rather than a Zener diode operating in breakdown mode. Other diode types arranged in various configurations configured to produce the same or similar effect as the Zener diode may also be employed in various implementations.

In implementations of voltage sensing circuits like those disclosed herein, the offset of the comparator and other internal non-idealities translate directly (1:1) into observed variation of the sensed threshold voltage (the comparison voltage). This contrasts with the performance of the resistive divider system 2 previously discussed where the effect of the non-idealities are multiplied by the gain of the divider. Because of this, threshold voltage sensing circuits like those disclosed herein may demonstrate more stable performance over variations of the supply voltage and variations of temperature than the resistive divider system 2. Furthermore, implementations of voltage sensing circuits like those disclosed herein may have much lower area when physically implemented when compared with resistive divider circuit systems 2, particularly where low quiescent currents from the device are specified. Also, the accuracy of sensing the movement of the supply voltage away from or toward a threshold voltage may be improved without using any form of trimming.

Figure 4:
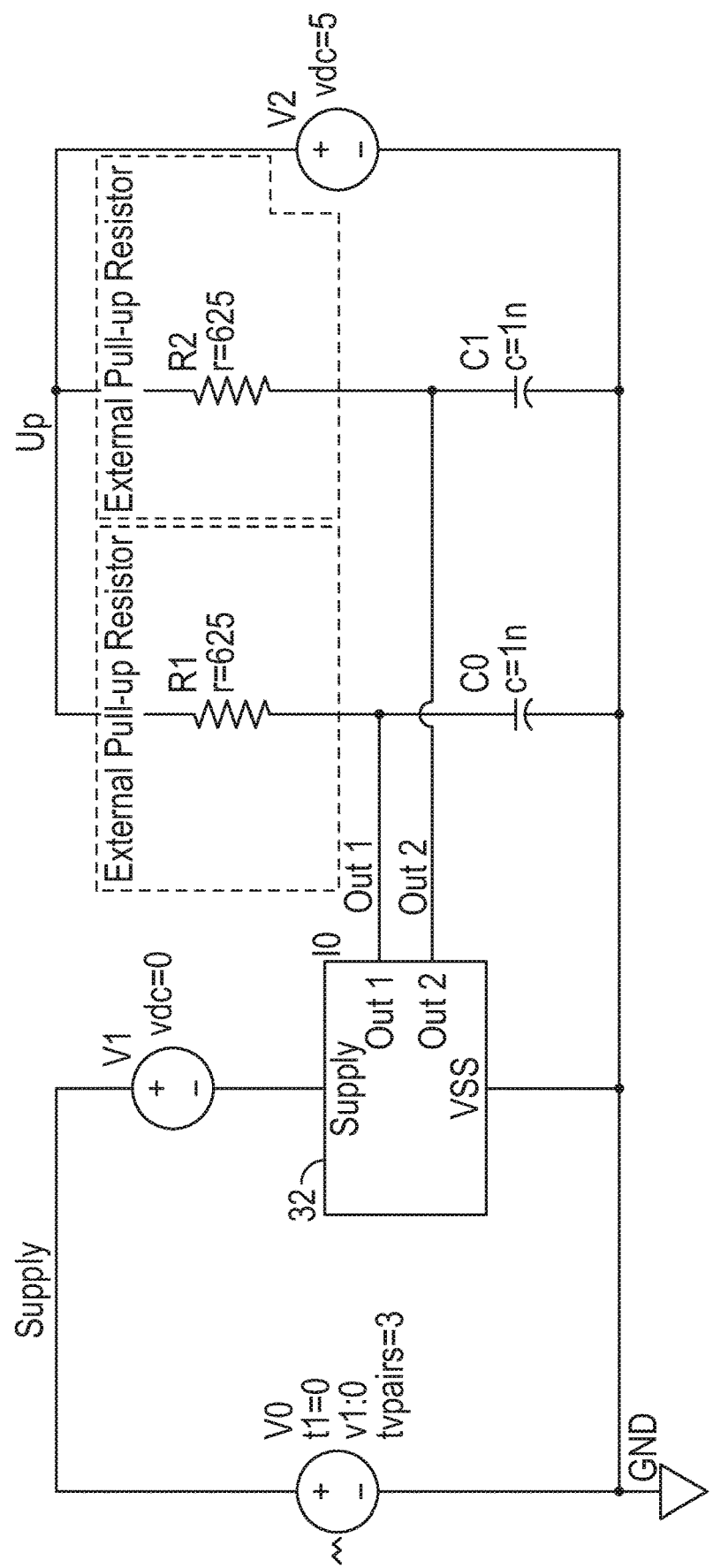
FIG. 4 is a schematic of a system model circuit used for testing implementations of voltage sensing circuits.

Referring to FIG. 4, a schematic of a circuit used to perform Monte Carlo simulations of the circuit 14 illustrated in FIG. 3 is illustrated. The circuit 14 of FIG. 3 was placed in the box 32 in the center of the figure with the supply voltage entering and vss leaving along with out1 and out2 (multiple outputs). Out1 is an open drain output with a 625 ohm external resistor connected to the supply voltage pin of the circuit. The same temperature ranges and rising and falling voltage ranges were then applied to the circuit during 300 Monte Carlo runs conducted at each temperature (−10° C., 27° C., 85° C.).

Figure 5:
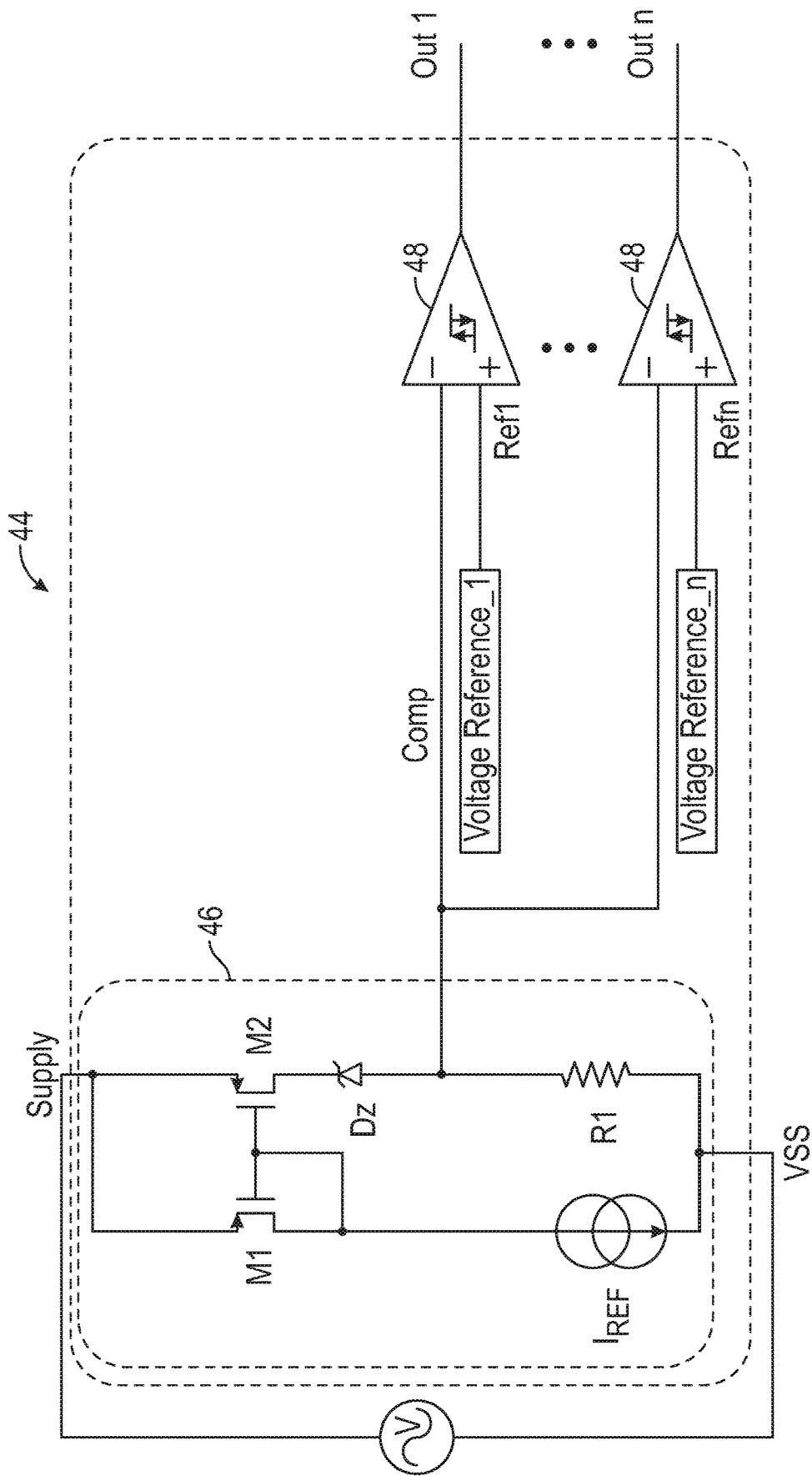
FIG. 5 is a schematic of an implementation of a voltage sensing circuit having multiple voltage references and comparators, one for each of the outputs.

Referring to FIG. 5, another implementation of a threshold voltage sensing system 44 is illustrated. As illustrated, the smaller section 46 of the circuit in dotted lines is the portion that differs from the resistive divider circuit 2 in FIG. 1, and this portion of the circuit processes the supply voltage to generate the comparison voltage. In this implementation, a version of the circuit designed to provide a comparison voltage to multiple comparators 48 is illustrated. As illustrated, multiple comparators 48 can have one input coupled with the comparison voltage output of the threshold voltage sensing circuit and a second input coupled to various reference voltage. In such implementations, the outputs of each of the multiple comparators can vary from each other in logic levels (0, 1, etc.) depending on the value of the comparison voltage and the value of the particular reference voltage used by each comparator. In various implementations disclosed in this document, the comparators may be open-drain or push-pull. As illustrated, n comparators may be coupled to the comparison voltage output of the threshold voltage circuit, connected to n reference voltages and producing n outputs from the system. The various n references voltages may be the same value, all different values, or various combinations of the same and different values in various implementations. Also, the supply voltage may be an alternating current (AC) voltage source in various implementations.

Figure 6:
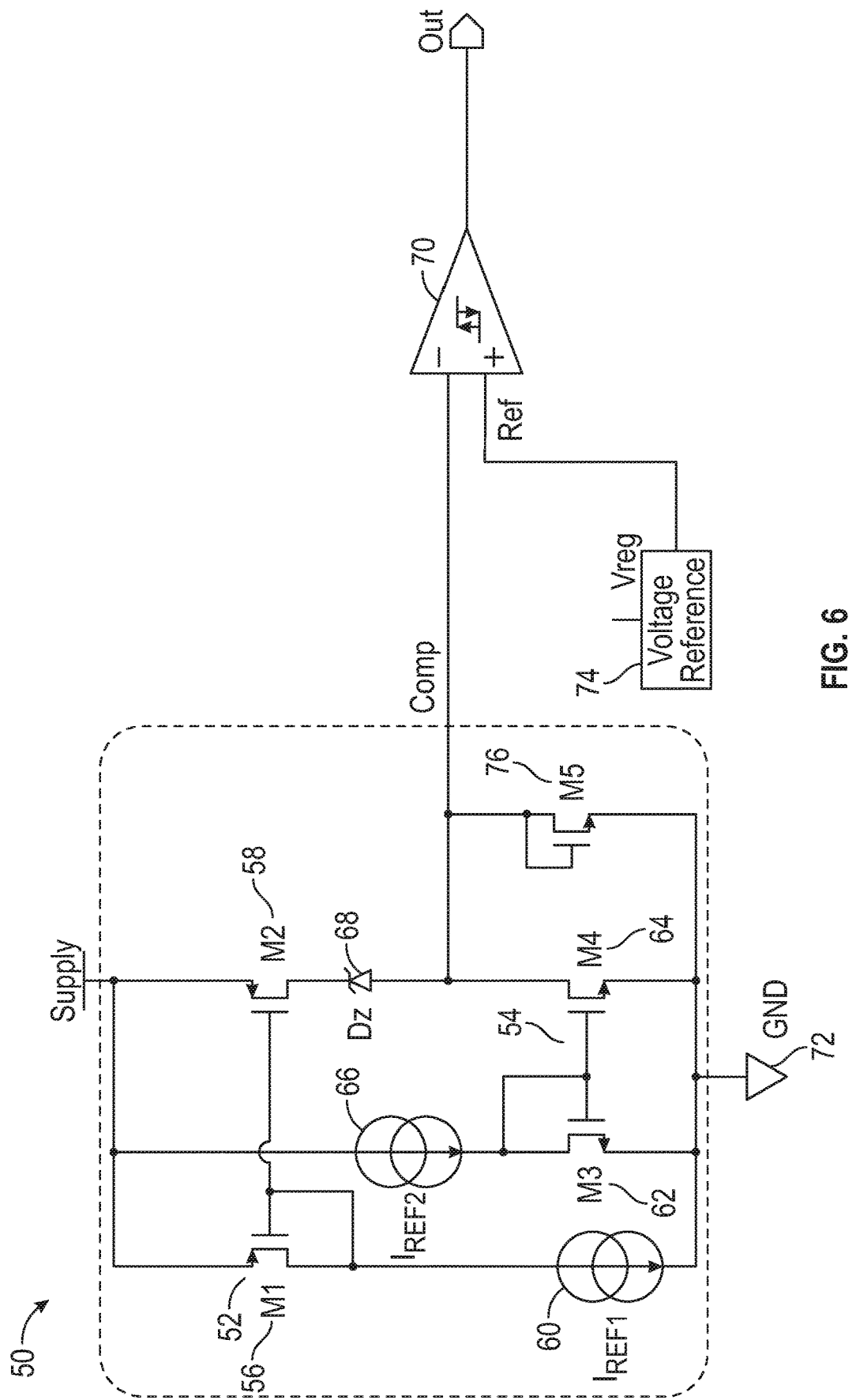
FIG. 6 is a schematic of an implementation of a voltage sensing circuit having two current mirrors.

Referring to FIG. 6, another implementation of a threshold voltage sensing system 50 is illustrated. The system includes a first high side current mirror 52 and a second low side current mirror 54. The first high side current mirror 52 includes a first transistor 56 and a second transistor 58. The first high side current mirror 52 is coupled to a first reference current 60. The second low side current mirror 54 includes a third transistor 62 and a fourth transistor 64. As can be seen, the second low side current mirror 54 is coupled to a second reference current 66. There is one diode 68 coupled between the first high side current mirror 52 and the second low side current mirror 54. In other implementations, there may be more than one diode. The diode 68 illustrated is a Zener diode in this implementation, though any of the other diode implementations disclosed in this document could be used in place of the Zener diode. The diode 68 is coupled to a comparator 70. As illustrated, the first high side current, the second low side current, and the diode are coupled to ground 72. The comparator is coupled with a reference voltage 74 and is configured to receive a comparison voltage from the diode 68. The comparator 70 is configured to output whether the comparison voltage is one of higher and lower than the reference voltage 74. In this particular implementation, a current passed by the second transistor will be greater than a current passed by the fourth transistor.

As shown in FIG. 6, this implementation also includes a fifth transistor 76. The fifth transistor 76 is coupled between the second low side current mirror 54 and the comparator 70. The gate of the fifth transistor 76 is coupled to the output of the fifth transistor. In various implementations, each of the transistors may include a p-channel metal-oxide-semiconductor field-effect (PMOS) transistor. As illustrated, a gate of the first transistor 56 and a gate of the second transistor 58 are coupled to a drain of one of the first transistor or the second transistor. Likewise, a gate of the third transistor 62 and a gate of the fourth transistor 64 are coupled to a drain of one of the third transistor 62 or the fourth transistor 64.

Figure 7:
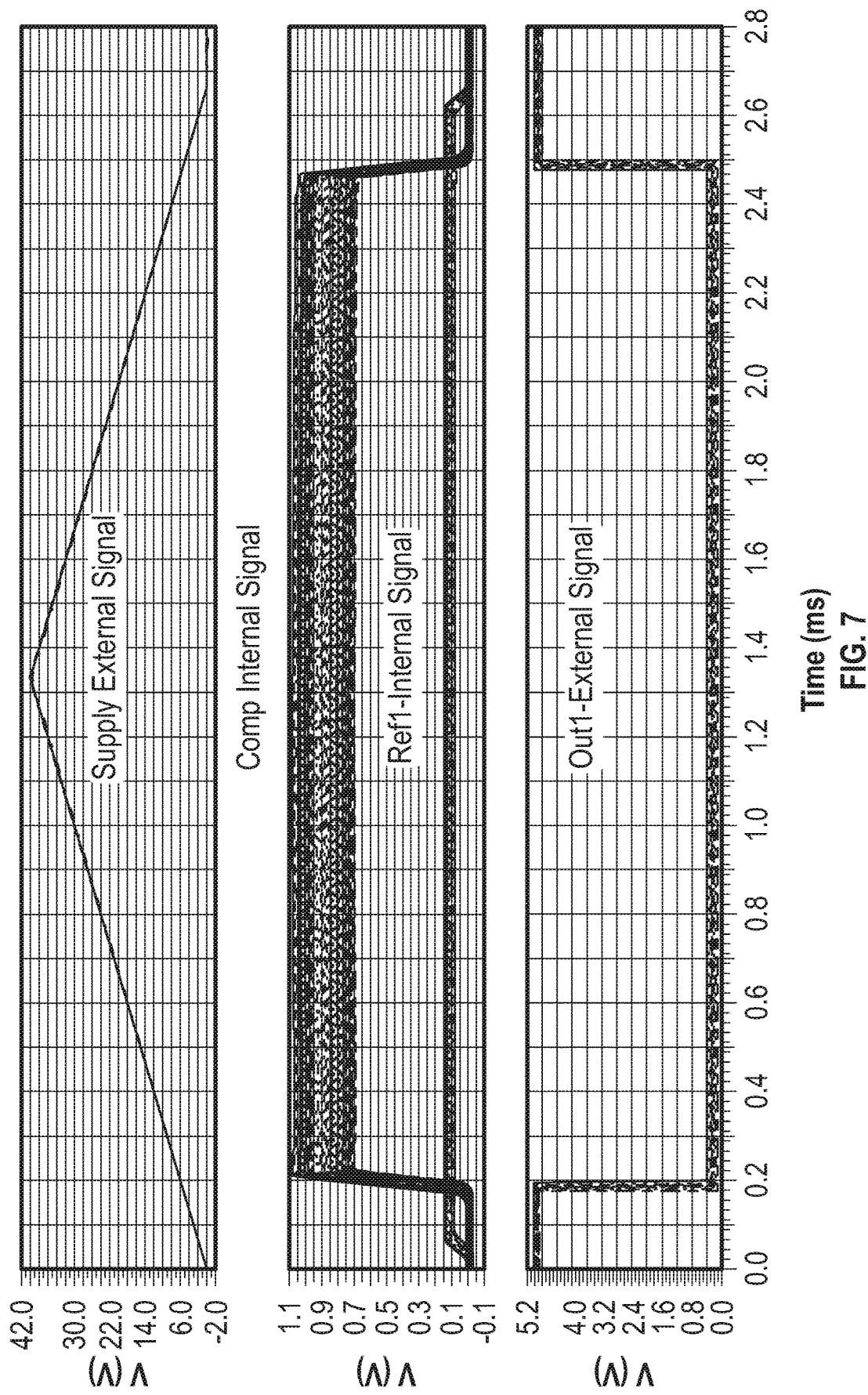
FIG. 7 are graphs illustrating the transient response of the circuit of FIG. 3 in the system of FIG. 4 to the rising and falling of the supply voltage.

The graph in FIG. 7 illustrates the transient response of the circuit of FIG. 3 in the system of FIG. 4 to the rising and falling of the supply voltage (SUPPLY external signal). As can be seen, the comparison voltage (COMP internal signal) remains substantially constant across the entire period of time the supply voltage rises and falls. When the out1 signal reached 2.8 V, the circuit was regarded to have indicated that the comparator had output a signal based on comparing the comparison voltage and the reference voltage indicating that the supply voltage had reached 5.3 V. For system implementations with multiple outputs, when the output OUTn transitions from high to low or from low to high (depending on the polarity of the signal applied to the input of the comparator), this acts to signal that the monitoring voltage has reached a desired value of Vbreakdown_Zener+Vrefn (the nth reference voltage). By inspection, it is clear that the output voltage was only present across the range when the supply voltage reached 5.3 V on the rising side or the falling side, the desired threshold voltage for this simulation. In the middle of the range, the out1 signal remained below the trigger amount. By inspection of FIG. 5, no false triggering of the circuit was observed in response to the changes in the supply voltage. The slope of the supply voltage on the rising and falling sides was 30 mV/msec.

Figure 8:
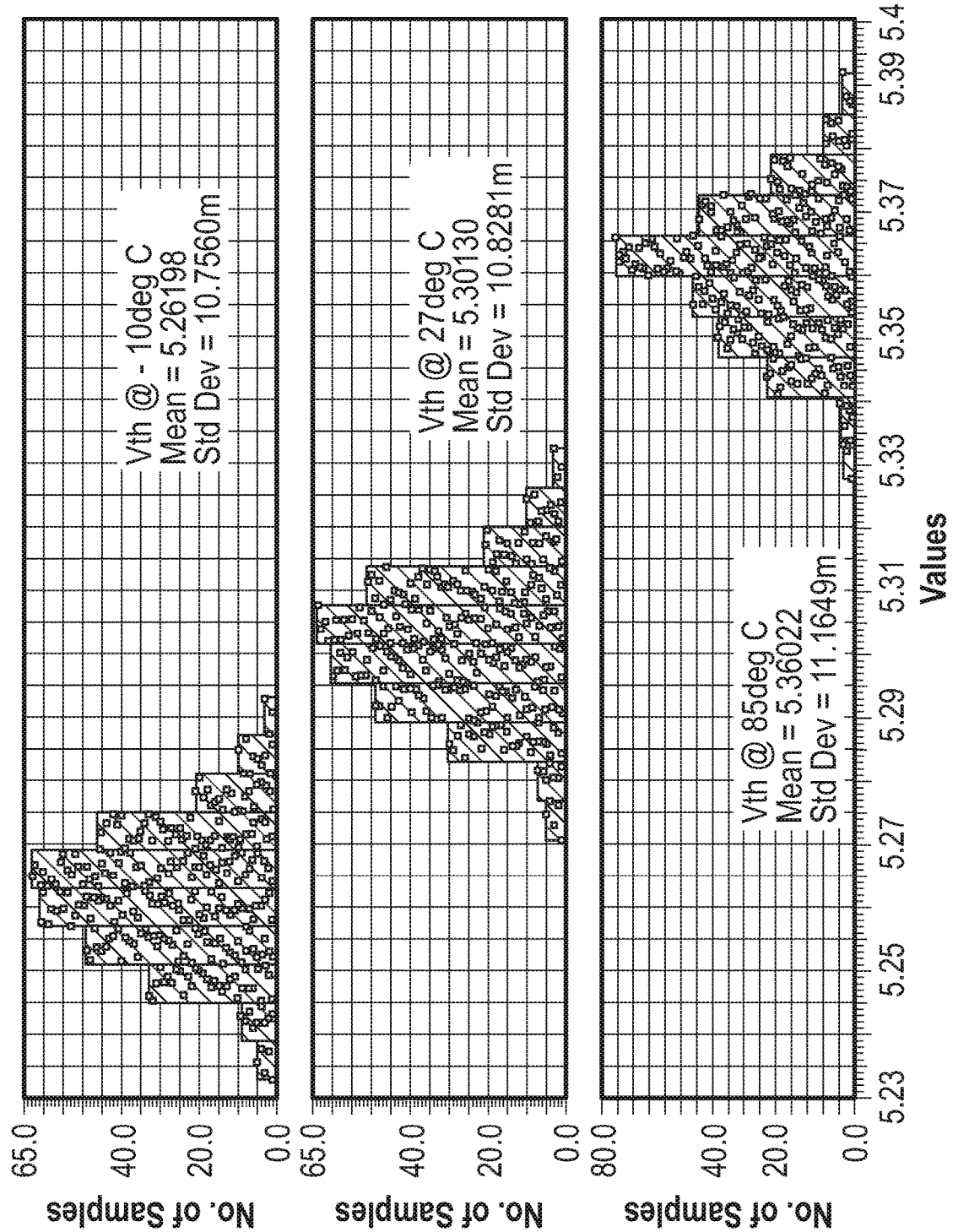
FIG. 8 shows histograms of the supply voltage value when the Out from the comparator reached 2.8 V when the supply voltage was rising for the circuit in FIG. 3.
Figure 9:
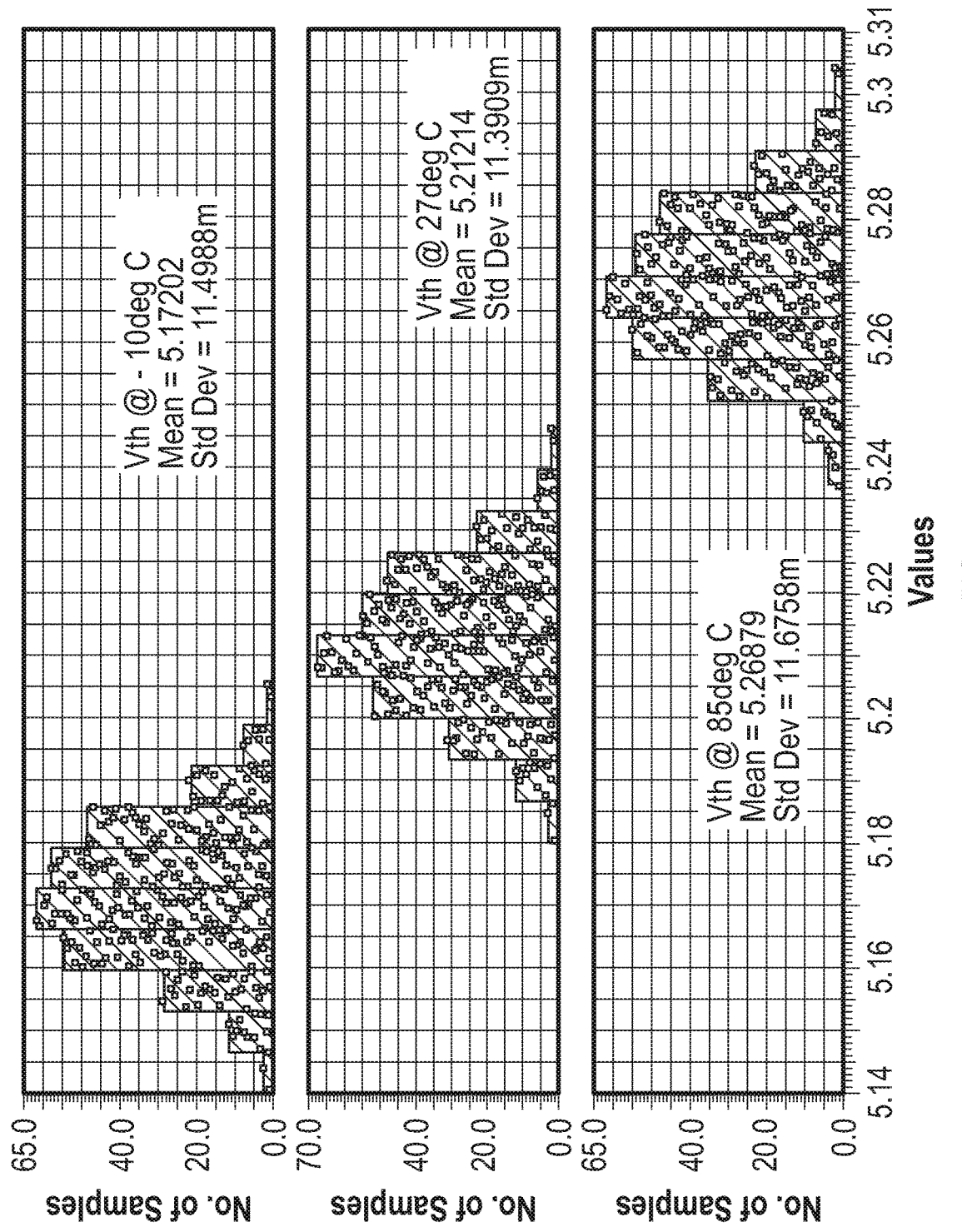
FIG. 9 is a corresponding histogram of FIG. 8 of the supply voltage value when the supply voltage was falling.

Referring to FIG. 8, histograms of the supply voltage value when the out1 from the comparator reached 2.8 V for each run in the Monte Carlo simulations are illustrated when the supply voltage is rising. The histogram shows the effects of the process and temperature variation for a desired sensed voltage during a rising voltage ramp of 5.3 V nominal supply voltage. The rising threshold in this analysis was defined as the value of the supply voltage when out1 reached 2.8 V from a high-to-low transition, communicated by the system as the output of the comparator out1 switching its logic value. A falling threshold was defined as the value of the supply voltage when out1 reached 2.8 V from a low-to-high transition. As can be observed from FIG. 7, the accuracy of the circuit is +/−1.3% of the typical value of the rising threshold value which was 5.301 V. Referring to FIG. 9, a corresponding histogram of the supply voltage value when the supply voltage was falling is illustrated. Again, as can be observed, the accuracy of the circuit is +/−1.4% of the typical value of the falling threshold which is 5.212 V.

Table 2 shows the results of the simulations for the rising threshold case while Table 3 shows the results of the simulations for the falling threshold case.

TABLE 2

| Temp [° C.] | Mean [V] | Std. Dev. [V] | UL = Mean + 6 * (Std. Dev.) [V] | LL = Mean − 6 * (Std. Dev.) [V] | (UL − Mean)/Mean [%] | (LL − Mean)/Mean [%] |
|---|---|---|---|---|---|---|
| −10 | 5.262 | 1.15E−02 | 5.331 | 5.193 | 1.3% | −1.3% |
| 27 | 5.301 | 1.16E−02 | 5.371 | 5.232 | 1.3% | −1.3% |
| 85 | 5.360 | 1.20E−02 | 5.432 | 5.288 | 1.3% | −1.3% |

TABLE 3

| Temp [° C.] | Mean [V] | Std. Dev. [V] | UL = Mean + 6 * (Std. Dev.) [V] | LL = Mean − 6 * (Std. Dev.) [V] | (UL − Mean)/Mean [%] | (LL − Mean)/Mean [%] |
|---|---|---|---|---|---|---|
| −10 | 5.171 | 1.25E−02 | 5.246 | 5.097 | 1.4% | −1.4% |
| 27 | 5.212 | 1.24E−02 | 5.286 | 5.137 | 1.4% | −1.4% |
| 85 | 5.268 | 1.30E−02 | 5.346 | 5.190 | 1.5% | −1.5% |

Comparing the variation values in Tables 2 and 3 with those in Table 1 demonstrates that the circuit implementation of FIG. 3 showed over an order of magnitude reduction in variation during operation than the resistive divider circuit system 2 of FIG. 1. This lower variation in voltage achieves the goal of the implementations of voltage sensing systems as described herein.

Figure 10:
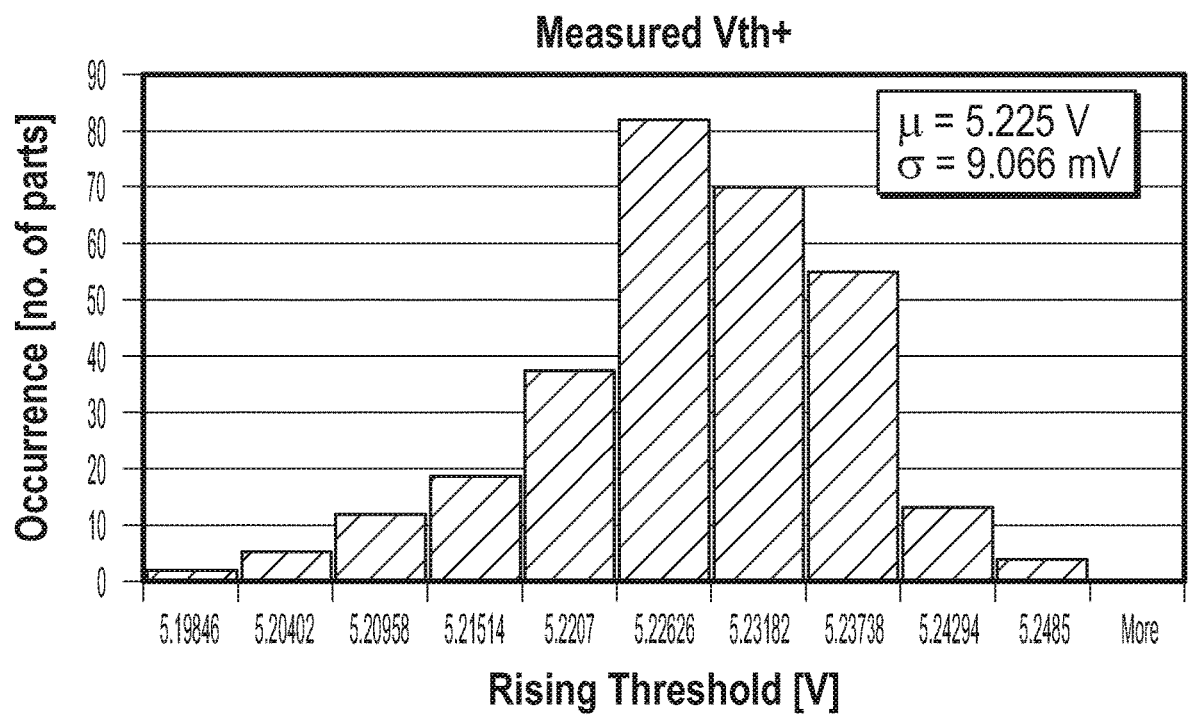
FIG. 10 is a histogram of the rising threshold voltage of an implementation of a voltage sensing circuit done using actual silicon chips at room temperature of 27° C.
Figure 11:
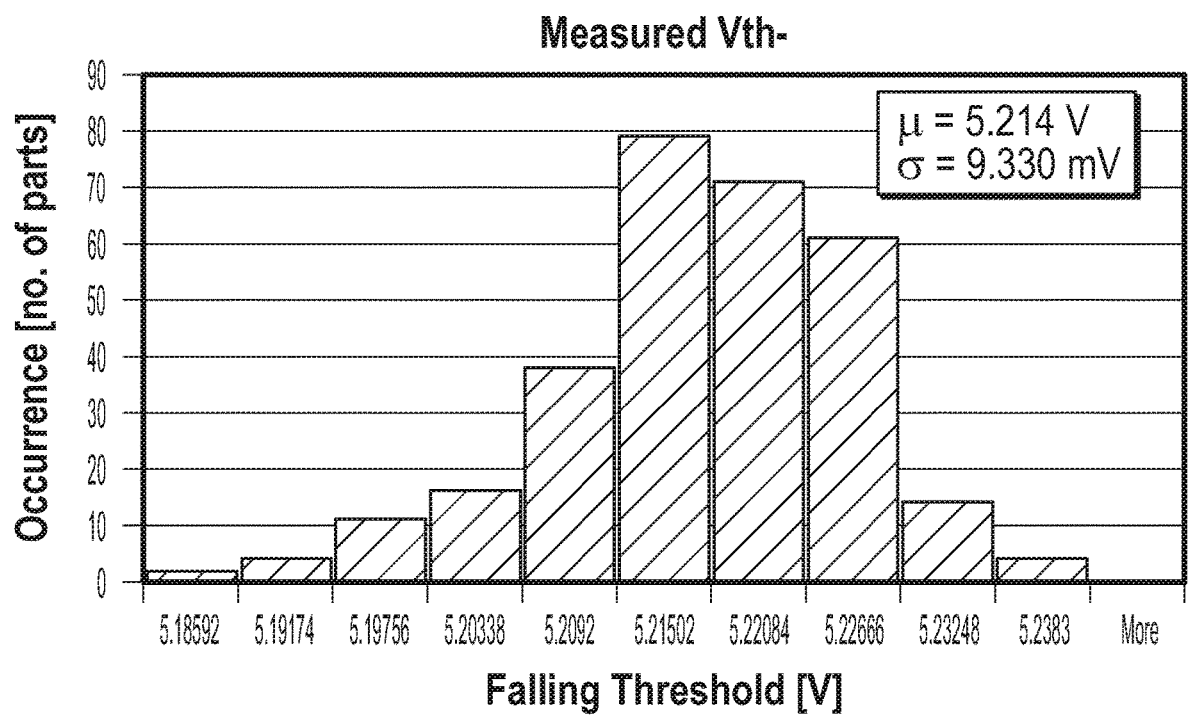
FIG. 11 is a histogram of the falling threshold voltage of an implementation of a voltage sensing circuit using actual silicon chips at room temperature of 27.0 corresponding with the histogram in FIG. 10.

Referring to FIGS. 10 and 11, histograms showing actual results from implementations of voltage sensing systems in silicon die are illustrated. The results illustrated in FIGS. 10 and 11 are from 300 measurements of parts at room temperature of 27 C. The same number of parts were used in the simulations results shown in FIGS. 8 and 9 making the results comparable between the simulations and actual parts. Referring to FIG. 10, the rising threshold voltage is graphed with a mean of 5.225 V. The data in FIG. 10 is comparable to the middle graph of FIG. 8 where the rising threshold in the simulations is charted at 27° C., the mean value is 5.301 V. Referring to FIG. 11, the falling threshold is graphed with a mean of 5.214 V. The data in FIG. 11 can be compared with the middle graph in FIG. 9 where the falling threshold in the simulations is charted at 27 C and the mean value is 5.212 V. These results indicate that in actual silicon die, the predicted performance of the voltage sensing systems is comparable to that predicted in the simulations. Comparing FIGS. 10 and 11 with the middle histogram in FIG. 2, illustrates proof of concept that implementations of sensing systems as described herein have a lower standard deviation across parts than resistor divider devices illustrated in FIG. 1.

In places where the description above refers to particular implementations of voltage sensing systems and implementing components, sub-components, methods and sub-methods, it should be readily apparent that a number of modifications may be made without departing from the spirit thereof and that these implementations, implementing components, sub-components, methods and sub-methods may be applied to other voltage sensing systems.

What is claimed is:

1. A voltage sensing system comprising:
a first high side current mirror comprising a first transistor and a second transistor, the first high side current mirror coupled to a first reference current;
a second high side current mirror comprising a third transistor and a fourth transistor, the second high side current mirror coupled to a second reference current;
a fifth transistor coupled between the second high side current mirror and the comparator;
at least one diode coupled between the first high side current mirror and the second high side current mirror, the at least one diode coupled to a comparator;
wherein the first high side current, the second high side current, and the at least one diode are coupled to ground;
wherein a current passed by the second transistor is greater than a current passed by the fourth transistor; and
wherein the comparator is coupled with a reference voltage and configured to receive a comparison voltage from the at least one diode and output whether the comparison voltage is one of higher and lower than the reference voltage.

2. The system of claim 1, wherein the fifth transistor is an n-channel metal-oxide-semiconductor field-effect (NMOS) transistor.

3. The system of claim 1, wherein the at least one diode is a Zener diode.

4. The system of claim 1, wherein a gate of the first transistor and a gate of the second transistor are coupled to a drain of one of the first transistor and the second transistor.

5. The system of claim 1, wherein a gate of the third transistor and a gate of the fourth transistor are coupled to a drain of one of the third transistor and the fourth transistor.

6. The system of claim 1, wherein the first current mirror and the second current mirror further comprise two PMOS transistors coupled together.

7. The system of claim 1, wherein the gate of the fifth transistor is coupled to the output of the fifth transistor.

8. A voltage threshold sensing system comprising:
two p-channel metal-oxide-semiconductor field-effect (PMOS) transistors coupled together, the gates of the two PMOS transistors coupled to the drain of a first one of the two PMOS transistors, the drain of the first one of the two PMOS transistors coupled with a constant current source, and a drain of a second one of the two PMOS transistors coupled to a diode;
wherein the diode is coupled with a high impedance input of a comparator and to a resistor coupled to ground; and wherein the comparator is configured to determine whether a supply voltage coupled to the second one of the two PMOS transistors is one of above and below a reference voltage coupled to another high impedance input of the comparator.

9. The system of claim 8, wherein the diode is a Zener diode.

10. The system of claim 8, further comprising a second comparator coupled with a second reference voltage and configured to receive a second comparison voltage from the diode and output whether the comparison voltage is one of higher and lower than the reference voltage.

* * * * *